(12) United States Patent
Seo et al.

(10) Patent No.: US 7,371,594 B2
(45) Date of Patent: May 13, 2008

(54) NITRIDE SEMICONDUCTOR DEVICE AND METHOD FOR FABRICATING THE SAME THAT MINIMIZES CRACKING

(75) Inventors: Jung Hoon Seo, Seoul (KR); Jun Ho Jang, Gyeonggi-do (KR); Jong Wook Kim, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 288 days.

(21) Appl. No.: 11/127,656

(22) Filed: May 11, 2005

(65) Prior Publication Data

US 2005/0258442 A1    Nov. 24, 2005

(30) Foreign Application Priority Data

May 18, 2004   (KR) ..................... 10-2004-0035299

(51) Int. Cl.
*H01L 33/00* (2006.01)
(52) U.S. Cl. .................... 438/28; 438/46; 438/458; 257/E33.056
(58) Field of Classification Search ............ 438/28; 257/E33.056
See application file for complete search history.

(56) References Cited

U.S. PATENT DOCUMENTS

| 5,453,405 | A  | * | 9/1995  | Fan et al. ................. 438/34 |
| 6,613,610 | B2 | * | 9/2003  | Iwafuchi et al. ........... 438/128 |
| 2003/0189212 | A1 | * | 10/2003 | Yoo .......................... 257/79 |
| 2005/0042784 | A1 | * | 2/2005  | Yanagisawa et al. ....... 438/28 |
| 2006/0163592 | A1 | * | 7/2006  | Tsai et al. ................. 257/94 |

* cited by examiner

*Primary Examiner*—Stephen W. Smoot
(74) *Attorney, Agent, or Firm*—Lee, Hong, Degerman, Kang & Schmadeka (57) ABSTRACT

The present invention relates to a nitride semiconductor device and a method for fabricating the same. According to the present invention, there is an advantage in that trenches isolating respective nitride semiconductor unit devices from one another are filled with crack-inhibiting walls to remove voids, thereby minimizing cracks or damage that may occur in the nitride semiconductor unit devices during a laser lift-off process.

In addition, there is an advantage in that the devices are bonded through a bonding-reinforcing plate or the crack-inhibiting walls to a carrier substrate with a bonding member coated thereon, thereby maintaining a strong bonding force to the carrier substrate.

23 Claims, 10 Drawing Sheets

Laser

Laser

NITRIDE SEMICONDUCTOR DEVICE AND METHOD FOR FABRICATING THE SAME THAT MINIMIZES CRACKING

CROSS-REFERENCE TO RELATED APPLICATIONS

Pursuant to 35 U.S.C. §119(a), this application claims the benefit of earlier filing date and right of priority to Korean Application No. 2004-0035299, filed on May 18, 2004, the contents of which are hereby incorporated by reference herein in their entirety.

BACKGROUND OF THE INVENTION

1. Field of the Invention

The present invention relates to a nitride semiconductor device and a method for fabricating the same, and more particularly, to a nitride semiconductor device and a method for fabricating the same, wherein a crack or damage that may occur in a nitride semiconductor unit device during a laser lift-off process can be minimized.

2. Description of the Related Art

Generally, a sapphire substrate is mainly employed as a substrate for nitride semiconductor growth. However, there are many difficulties in fabricating devices using nitrides due to the inherent conductivity of sapphire. Further, since the thermal conductivity of the sapphire is greatly inferior to other materials, it causes significant problems in driving the devices.

To solve these problems, a laser lift-off (LLO) method has been used conventionally.

The LLO method also has a disadvantage in that an entire sapphire substrate cannot be removed at a time due to limitations on the size and uniformity of a laser beam. Thus, a uniform but small sized laser beam is radiated on the sapphire substrate in a scanning manner to sequentially remove the substrate little by little.

However, non-uniformity is produced at an area of a separated device on which the laser beam has been radiated overlappingly. Thus, a crack produced due to this non-uniformity propagates into other areas of the device.

To prevent such a phenomenon, there has been used a method in which a part of a nitride layer is etched to separate each device that in turn is bonded to a Si substrate, a GaAs substrate, a metallic plate or the like, and a sapphire substrate is then removed therefrom.

However, air remaining in voids, which have been formed in trenches between the respective devices after the bonding process, expands due to intense laser energy and then creates cracks in the devices.

SUMMARY OF THE INVENTION

Accordingly, the present invention is conceived to solve the aforementioned problems. An object of the present invention is to provide a nitride semiconductor device and a method for fabricating the same, wherein trenches isolating respective nitride semiconductor unit devices from one another are filled with crack-inhibiting walls to remove voids, thereby minimizing cracks or damage that may occur in the nitride semiconductor unit devices during a laser lift-off process.

Another object of the invention is to provide a nitride semiconductor device and a method for fabricating the same, wherein the crack-inhibiting walls are made of a dielectric material to lessen reactions with the unit devices, which are caused by heat applied during the bonding process, thereby preventing deterioration of the electrical and optical properties of the devices and providing electrical insulation between the nitride semiconductor unit devices by means of its inherent insulation property.

A further object of the invention is to provide a nitride semiconductor device and a method for fabricating the same, wherein the dielectric material can be used as a protective layer, and nitride semiconductor devices are bonded through a bonding-reinforcing plate or the crack-inhibiting walls to a carrier substrate with a bonding member coated thereon, thereby maintaining a strong bonding force to the carrier substrate.

According to a first aspect of the present invention for achieving the objects, there is provided a method for fabricating a nitride semiconductor device, comprising the steps of (a) forming repeatedly nitride semiconductor unit devices, which are isolated from one another by trenches as empty spaces formed therebetween, on a substrate; (b) forming electrodes on the respective nitride semiconductor unit device; (c) forming crack-inhibiting walls within the respective trenches; (d) forming a bonding-reinforcing plate made of a conductive material on the electrodes and the crack-inhibiting walls; (e) bonding a carrier substrate to the bonding-reinforcing plate through a bonding member; and (f) removing the substrate from the nitride semiconductor unit devices and the crack-inhibiting walls through a laser lift-off process.

According to a second aspect of the present invention, there is provided a method for fabricating a nitride semiconductor device, comprising the steps of (a) forming repeatedly nitride semiconductor unit devices, which are isolated from one another by trenches as empty spaces formed therebetween, on a substrate; (b) forming electrodes on the respective nitride semiconductor unit device; (c) forming crack-inhibiting walls within the respective trenches; (d) forming a bonding-reinforcing plate by depositing a conductive material on the electrodes to be flush with upper surfaces of the crack-inhibiting walls; (e) bonding a carrier substrate to the bonding-reinforcing plate through a bonding member; and (f) removing the substrate from the nitride semiconductor unit devices and the crack-inhibiting walls through a laser lift-off process.

According to a third aspect of the present invention, there is provided a method for fabricating a nitride semiconductor device, comprising the steps of (a) forming a plurality of nitride semiconductor unit devices, which are isolated from one another by empty spaces with predetermined volume, on a substrate; (b) forming first electrodes on the respective nitride semiconductor unit devices; (c) forming insulation layers by filling the empty spaces with an insulation material; (d) forming a conductive material layer on the first electrodes and the insulation layers; (e) forming a support member to be fixed on the conductive material layer; (f) removing the substrate from the bottoms of the plurality of nitride semiconductor unit devices; and (g) forming second electrodes on the bottoms of the respective nitride semiconductor unit devices.

According to a fourth aspect of the present invention, there is provided a method for fabricating a nitride semiconductor device, comprising the steps of (a) forming a plurality of light-emitting devices each of which includes a nitride semiconductor layer and which have insulation layers interposed therebetween, on a substrate; (b) forming a first conductive material layer on the light-emitting devices and the insulation layers; (c) forming a support member to be fixed on the first conductive material layer; (d) removing the substrate from the bottoms of the plurality of light-emitting devices; and (e) forming a second conductive material layer on the bottoms of the light-emitting devices.

According to a fifth aspect of the invention, there is provided a nitride semiconductor device, comprising a plurality of light-emitting devices each of which includes a nitride semiconductor layer and have insulation layers interposed therebetween; a first conductive material layer formed on the light-emitting devices and the insulation layers; a support member fixed on the first conductive material layer; and a second conductive material layer formed on the bottoms of the light-emitting devices.

BRIEF DESCRIPTION OF THE DRAWINGS

The above and other objects, features and advantages of the present invention will become apparent from the following description of preferred embodiments given in conjunction with the accompanying drawings, in which:

FIGS. 1a to 1i are views illustrating a method for fabricating a nitride semiconductor device according to a first embodiment of the present invention;

FIGS. 2a to 2e are views illustrating a method for fabricating a nitride semiconductor device according to a second embodiment of the present invention;

DETAILED DESCRIPTION OF THE INVENTION

Hereinafter, preferred embodiments of the present invention will be described in detail with reference to the accompanying drawings.

First, a method for fabricating a nitride semiconductor device according to a first embodiment of the invention will be explained below with reference to FIGS. 1a to 1i.

First Embodiment

Figure 1A:
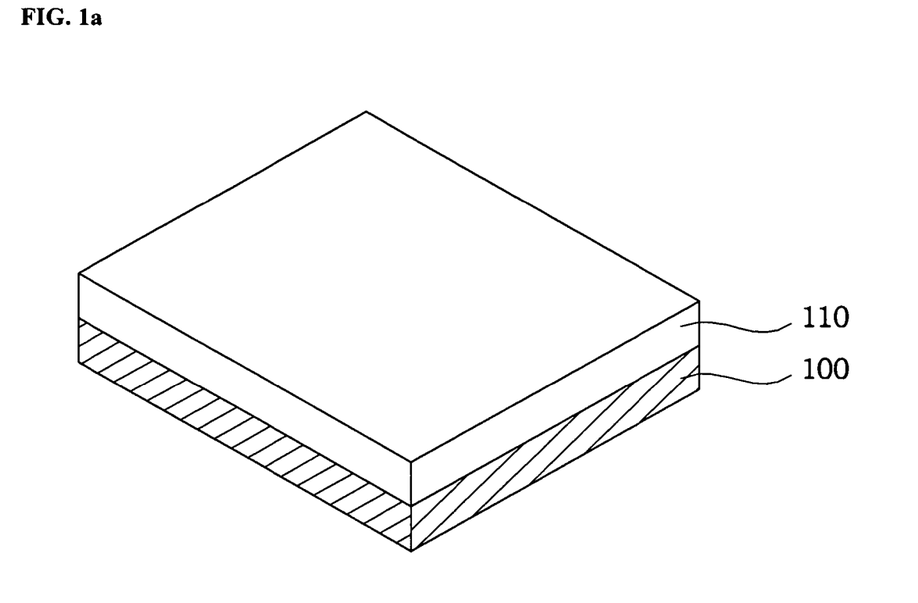
Figure 1B:
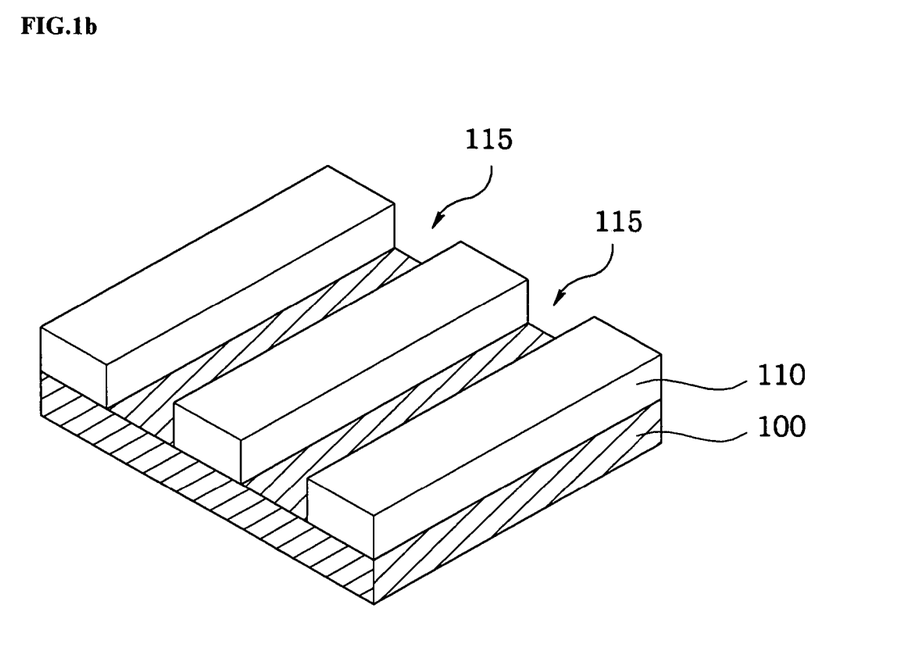

First, as shown in FIG. 1a, a nitride semiconductor is deposited on a heterogeneous sapphire substrate 100. Then, trenches 115 are formed through removal of the material at predetermined intervals to provide a plurality of nitride semiconductor unit devices 110, as shown in FIG. 1b.

That is, the nitride semiconductor unit devices 110 are repeatedly formed on the sapphire substrate 100 while being spaced apart from one another by the trenches 115.

Figure 1C:
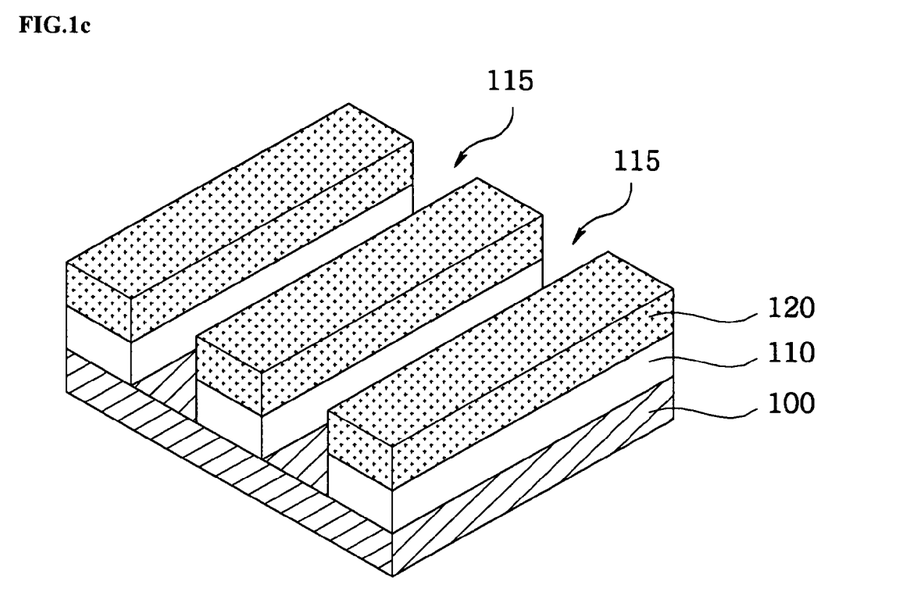
Figure 1D:
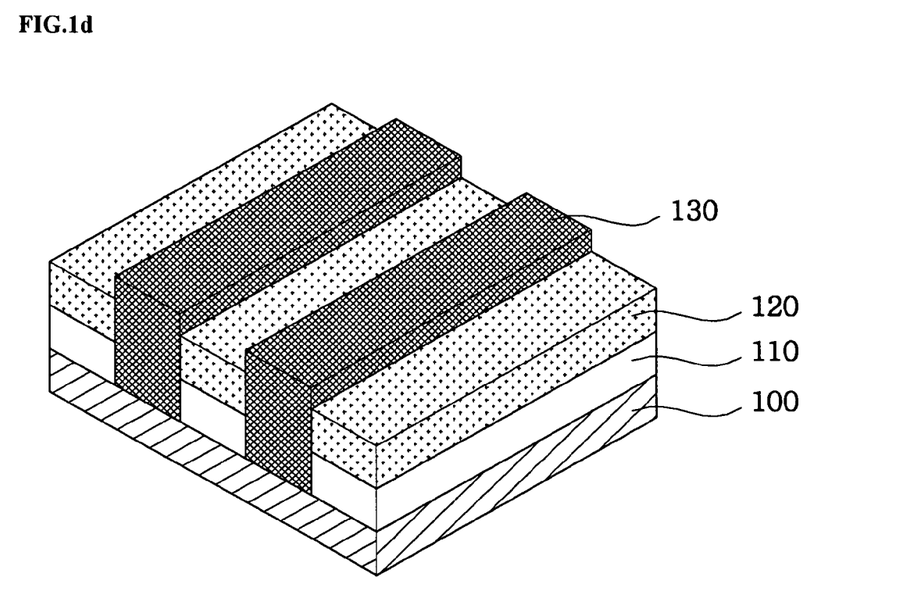

Thereafter, upper portions of the sapphire substrate 100 exposed through the trenches 115 and the nitride semiconductor unit devices 110 formed thereon are entirely coated with a conductive metal by means of a deposition method. Then, the conductive metal coated in the trenches 115 is removed so that the conductive metal remains on only the tops of the nitride semiconductor unit devices 110 as shown in FIG. 1c, thereby forming first electrodes 120 through which an externally applied driving current is transmitted to the nitride semiconductor unit devices 110.

Next, the upper portions of the sapphire substrate 100 exposed through the trenches 115 and the first electrodes 120 are coated with a dielectric material. Then, upper portions of the first electrodes 120 are partially removed such that the dielectric material remains filled only in the trenches 115 and has upper surfaces at a level slightly higher than those of upper surfaces of the first electrodes 120, thereby forming crack-inhibiting walls 130 according to the present invention (see FIG. 1d).

Particularly, to minimize the occurrence of cracks in the nitride semiconductor unit devices during a subsequent laser lift-off process, it is important to completely fill the respective trenches with the dielectric material without leaving voids therein. A preferred dielectric material includes polyimide or benzocyclobutene (BCB), which can be easily deposited and filled into the trenches.

As described above, the present invention employs a dielectric material for filling the trenches to remove voids. Thus, interfaces of the unit devices within the trenches are less subjected to reaction due to heat applied in a subsequent bonding process, thereby preventing deterioration of the electrical and optical properties of the devices. In addition, the dielectric material filled in the trenches enables electrical insulation between the nitride semiconductor unit devices by means of its inherent insulation property and can also serve as a protective layer.

Figure 1E:
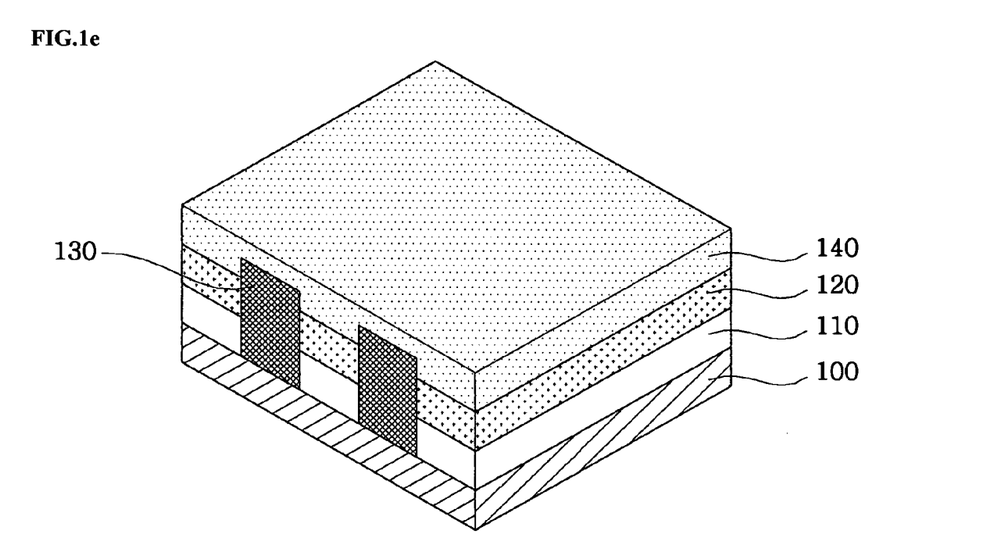

Meanwhile, when the crack-inhibiting walls 130 are formed according to the aforementioned process, exposed portions of the crack-inhibiting walls 130 and the first electrodes 120 are entirely coated with any of conductive metals such as Al, Cu and Cr to form a bonding-reinforcing plate 140 shown in FIG. 1e. Therefore, during a subsequent process of bonding a carrier substrate, an upper surface of bonding-reinforcing plate, which is made of the metal or conductive material, can easily react with a solder, which is mainly used as a bonding material, thereby maintaining a strong bonding force to the carrier substrate.

Figure 1F:
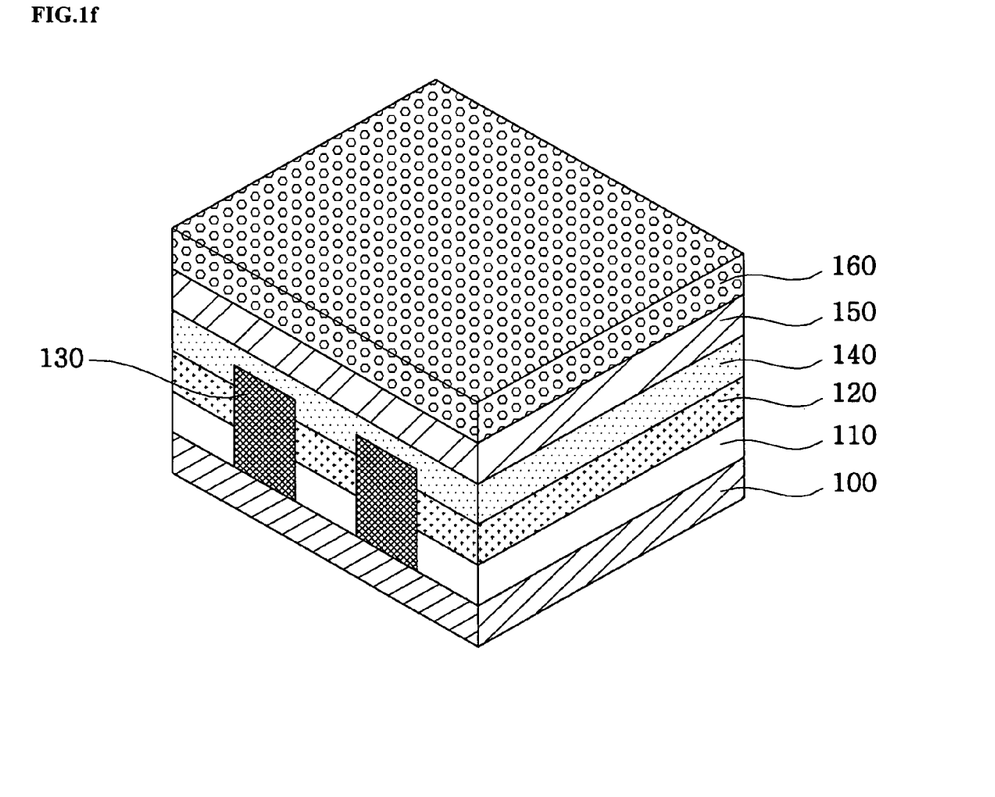

Thereafter, the carrier substrate 160 such as a Si substrate or a GaAs substrate is bonded, through a bonding member 150 such as a solder, to the bonding-reinforcing plate 140 (see FIG. 1f). Then, the sapphire substrate 100 coupled to the nitride semiconductor unit devices 110 is separated therefrom through a laser lift-off process (see FIG. 1g).

Figure 1G:
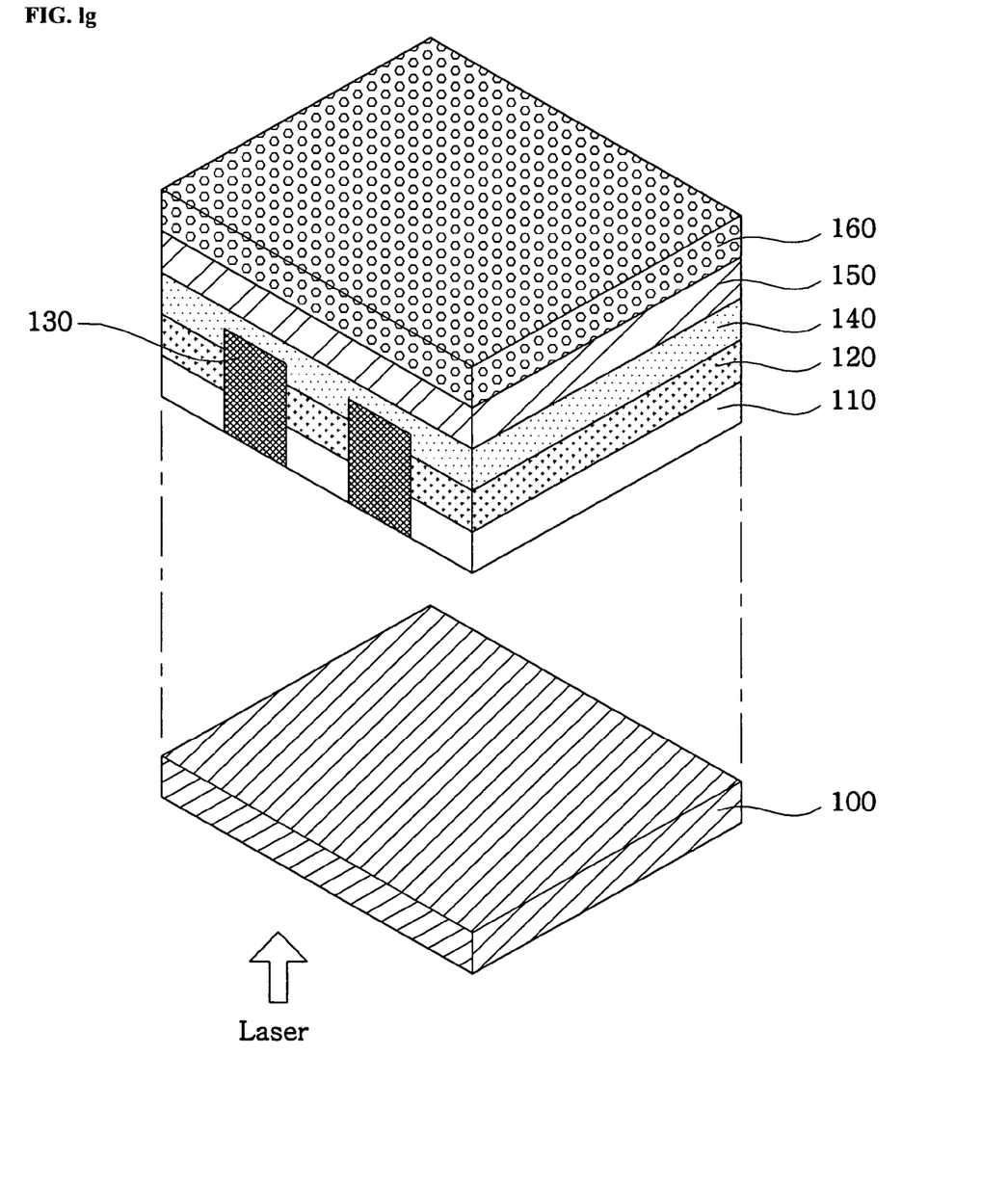

At this time, since the trenches isolating the nitride semiconductor unit devices 110 from one another are filled with the crack-inhibiting walls 130 to remove voids as described above, it is possible to minimize cracks or damage that may occur in the nitride semiconductor unit devices due to expansion of voids caused by laser energy applied during the laser lift-off process.

Figure 1H:
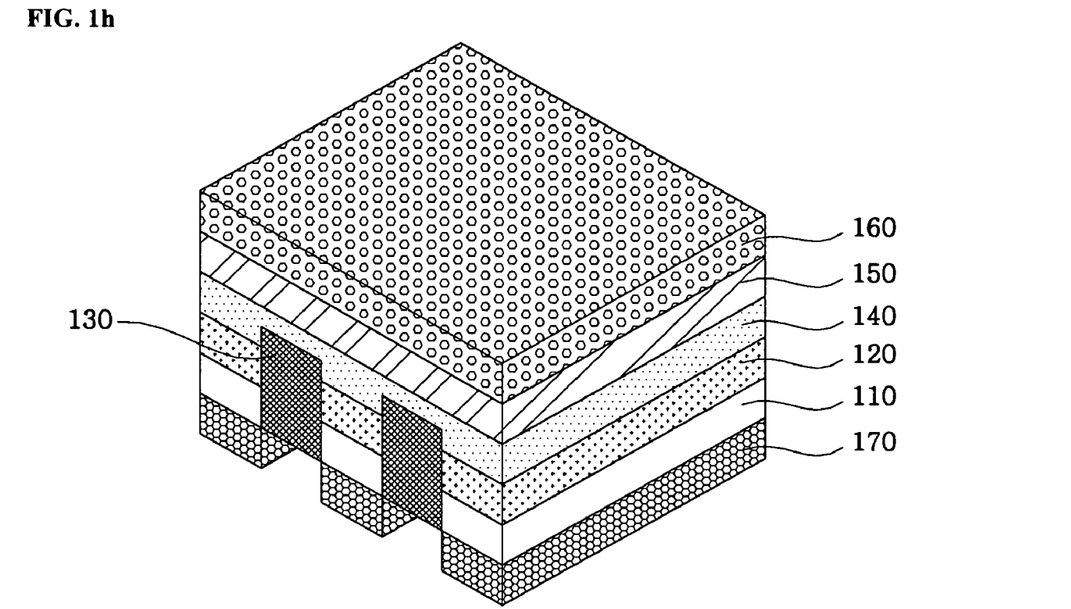
Figure 1I:
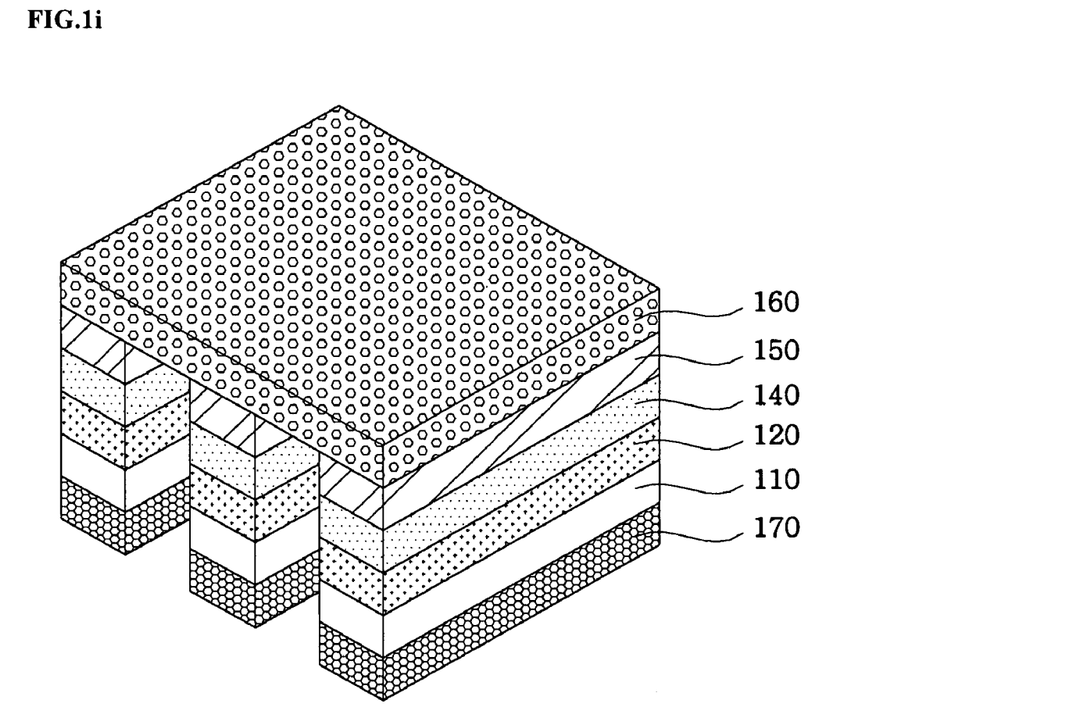

Meanwhile, after the sapphire substrate is separated through the laser lift-off process, second electrodes 170 are formed on lower surfaces of the respective nitride semiconductor unit devices (see FIG. 1h). Then, as shown in FIG. 1i, the crack-inhibiting walls 130 separated from the sapphire substrate 100, and corresponding portions of other layers are etched in a vertical direction until a lower surface of the carrier substrate 160 is exposed, thereby completing the method for fabricating a nitride semiconductor device according to the present invention.

According to the present invention described above, voids are removed by filling the trenches isolating the nitride semiconductor unit devices from one another with the crack-inhibiting walls. Thus, it is possible to minimize cracks or damage that may occur in the nitride semiconductor unit devices during the laser lift-off process.

In addition, since the crack-inhibiting walls are made of a dielectric material, the interfaces of the unit devices within the trenches are less subjected to reaction due to heat applied in the bonding process, thereby preventing deterioration of the electrical and optical properties of the devices.

Furthermore, the dielectric material enables electrical insulation between the nitride semiconductor unit devices by means of its inherent insulation property and can also be used as a protective layer. Moreover, the unit devices are bonded, through the bonding-reinforcing plate or the crack-inhibiting walls formed according to the present invention, to the bonding member coated on the carrier substrate, thereby maintaining a strong bonding force to the carrier substrate.

Hereinafter, a second embodiment of the present invention will be explained with reference to FIGS. 2a to 2e.

FIGS. 2a to 2e are views illustrating processes in the second embodiment of the present invention.

Second Embodiment

The second embodiment of the present invention is identical to the first embodiment until the crack-inhibiting walls are formed, but is different therefrom in view of the process of bonding a carrier substrate through a bonding member. The detailed procedures of the different process will be described below.

Figure 2A:
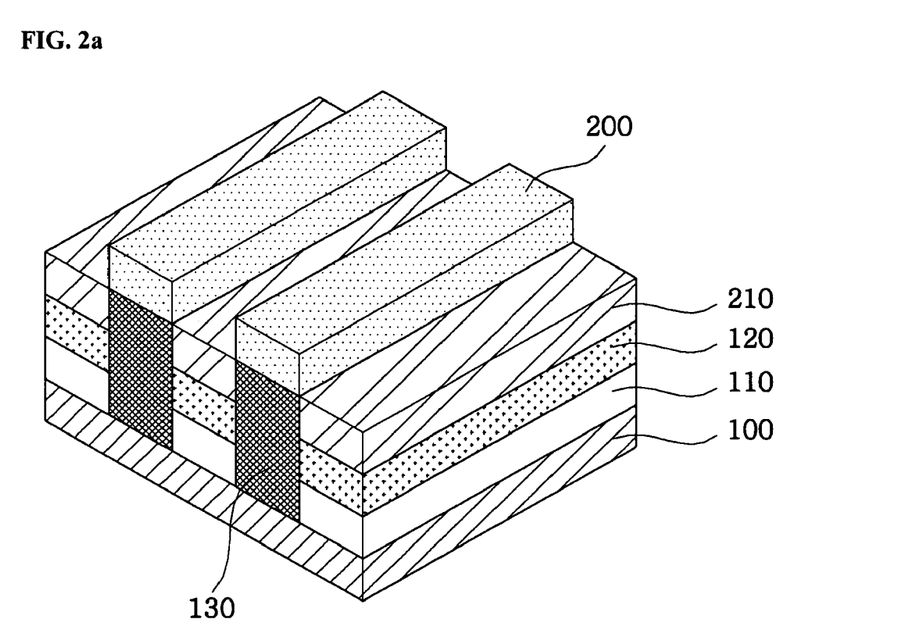

First, as shown in FIG. 2a, after the predetermined crack-inhibiting walls 130 are formed according to the present invention, a photoresist (PR) is deposited, developed and exposed to light so as to form a photoresist mask 200.

In the state where the crack-inhibiting walls 130 have been masked by the photoresist mask 200, any of conductive metals such as Al, Cu and Cr is deposited on every upper portions of the first electrodes 120 up to a level flush with the upper surfaces of the crack-inhibiting walls 130, thereby forming a bonding-reinforcing plate 210.

The photoresist mask 200 is then removed. Thereafter, the carrier substrate 160 such as a Si substrate or a GaAs substrate is bonded, through the bonding member 150 such as a solder, to the bonding-reinforcing plate 210 formed as above (see FIG. 2b).

Figure 2B:
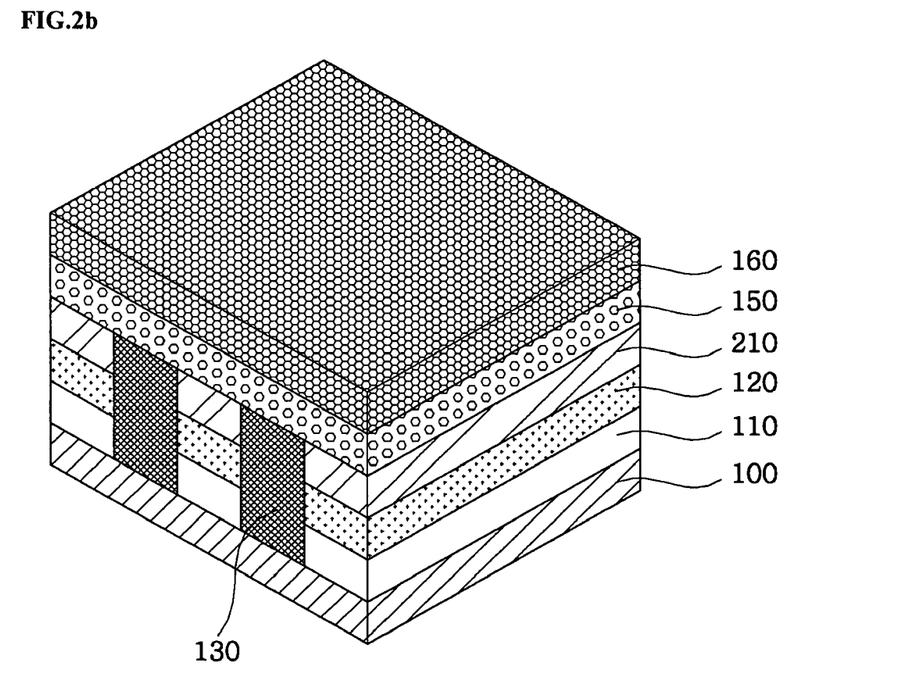

At this time, since the bonding-reinforcing plate 210 is made of the metal or conductive material, it can easily react with the bonding member 150 such as a solder when bonded to the carrier substrate 160. Therefore, a strong bonding force to the carrier substrate can be maintained.

Figure 2C:
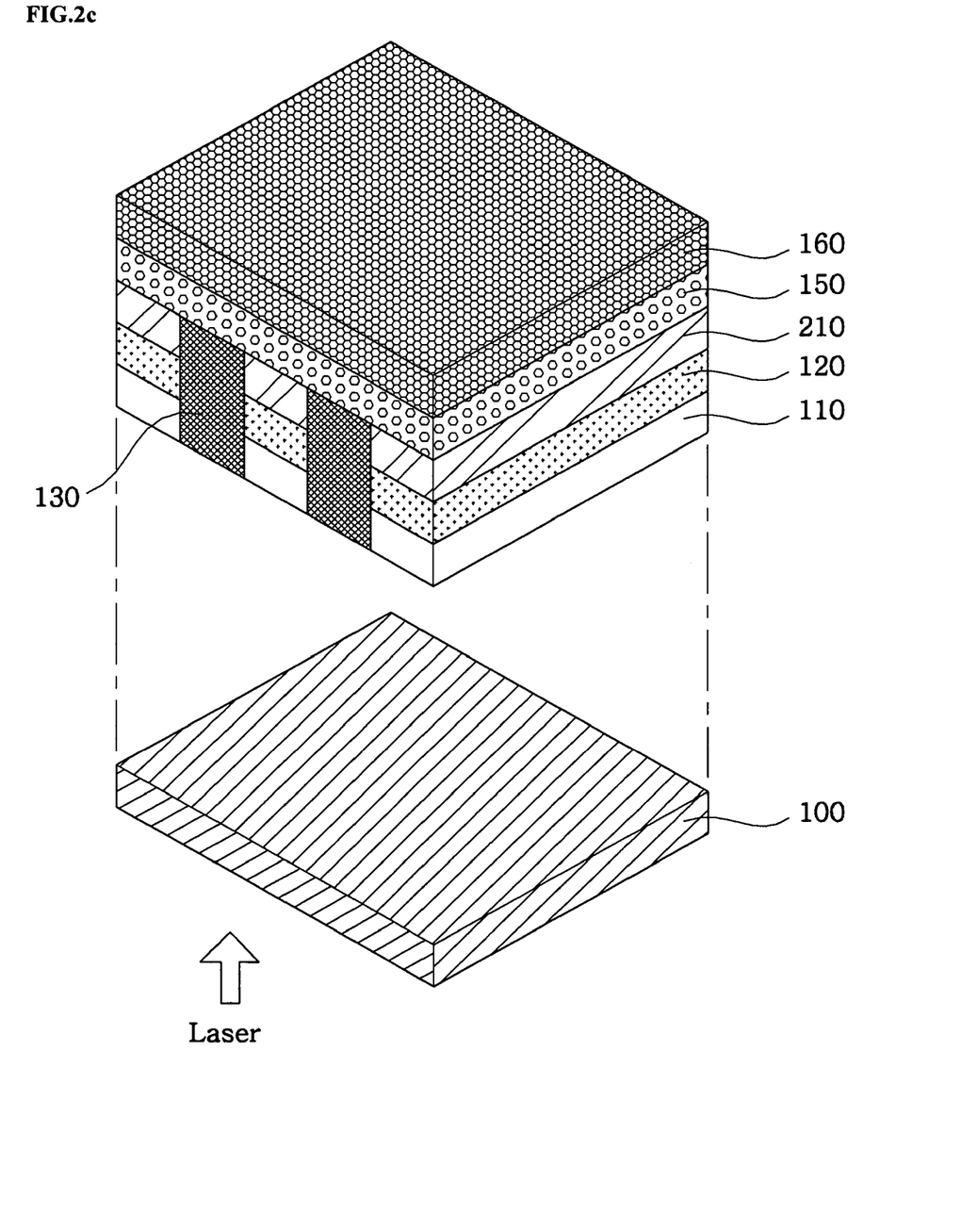

Meanwhile, upon completion of the bonding to the carrier substrate, as shown in FIG. 2c, the sapphire substrate 100 coupled to the nitride semiconductor unit devices 110 is separated therefrom through a laser lift-off process.

Figure 2D:
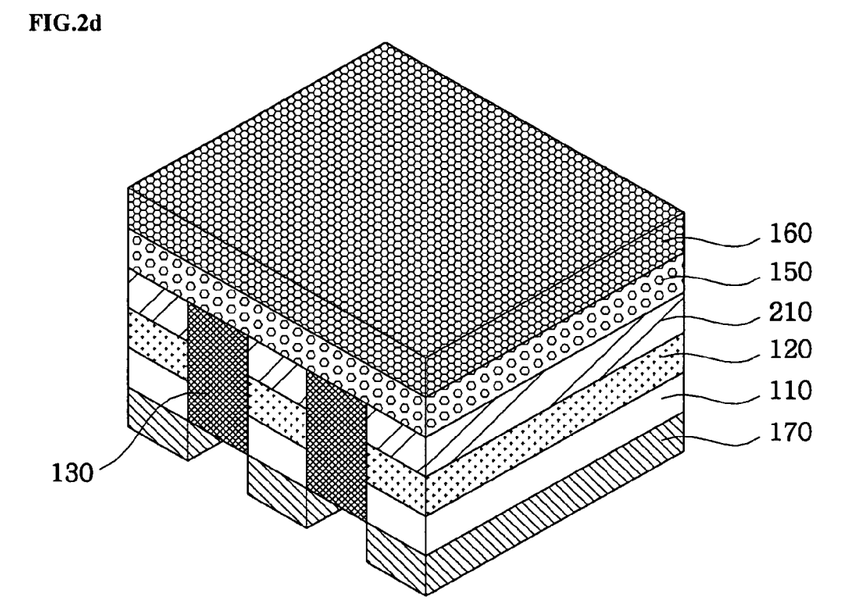

After the sapphire substrate 100 is separated through the laser lift-off process, second electrodes 170 are formed on lower surfaces of the respective nitride semiconductor unit devices (see FIG. 2d).

Figure 2E:
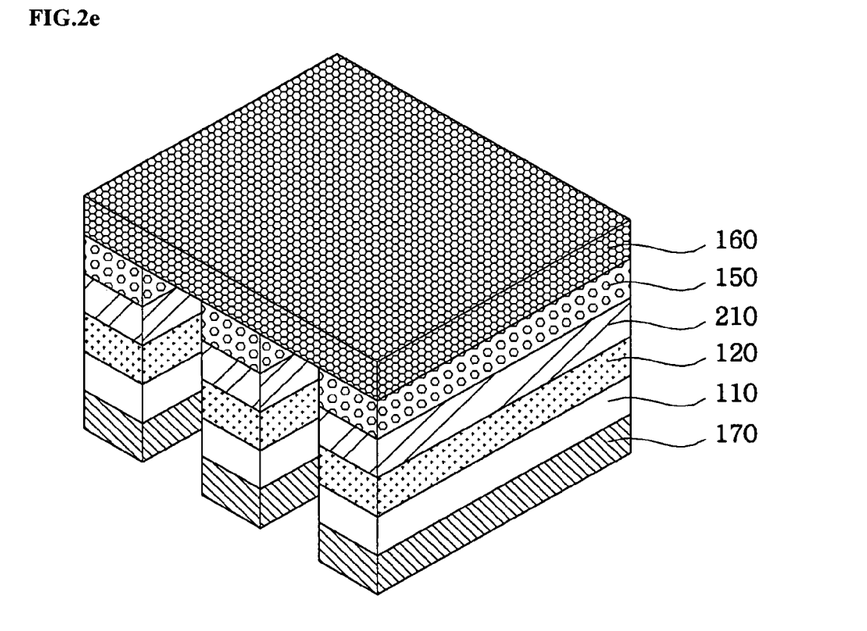

Finally, as shown in FIG. 2e, the crack-inhibiting walls 130 separated from the sapphire substrate 100 and the bonding member 150 are removed in a vertical direction until a lower surface of the carrier substrate 160 is exposed, thereby completing the method for fabricating a nitride semiconductor device according to the present invention.

Figure 3:
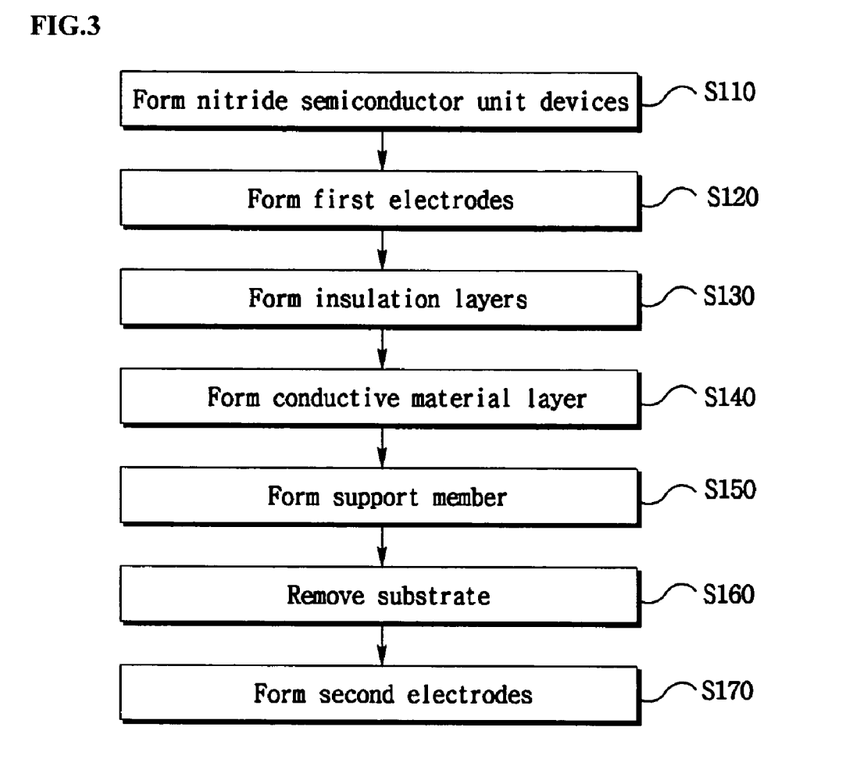
FIG. 3 is a flowchart illustrating a method for fabricating a nitride semiconductor device according to another embodiment of the present invention.

FIG. 3 is a flowchart illustrating a method for fabricating a nitride semiconductor device according to another embodiment of the present invention. First, a plurality of nitride semiconductor unit devices spaced apart from one another by empty spaces with predetermined volume are formed on a substrate (step S110).

Here, the substrate is preferably a non-conductive substrate such as a sapphire substrate.

Thereafter, a first electrode is formed on each of the plurality of nitride semiconductor unit devices (step S120).

Then, an insulation material is filled into the empty spaces to form insulation layers (step S130), and a conductive material layer is formed on the first electrodes and the insulation layers (step S140).

Subsequently, a support member is formed to be fixed to an upper surface of the conductive material layer (step S150), and the substrate is removed from the bottoms of the plurality of nitride semiconductor unit devices (step S160).

An already-prepared carrier substrate is used as the support member. If the carrier substrate is a substrate made of metal, it is fixedly bonded to the upper surface of the conductive material layer through a bonding member.

At this time, the bonding member is preferably a solder.

Further, the support member may be formed as a metallic film deposited on the conductive material layer.

Moreover, polyimide or benzocyclobutene (BCB) can be used as the insulation material.

Figure 5:
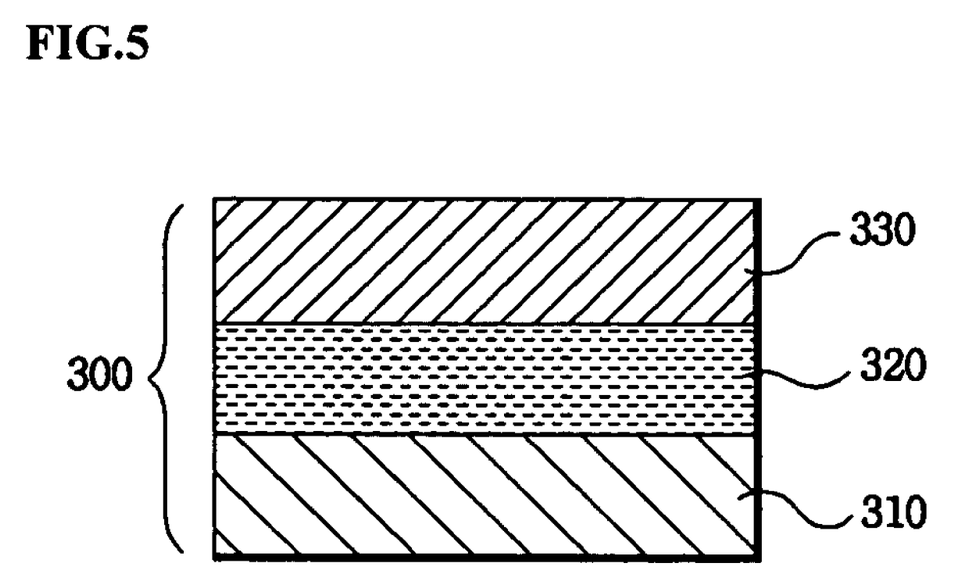
FIG. 5 is a schematic sectional view of the structure of a light-emitting device employed in the present invention.

Furthermore, the nitride semiconductor unit devices can be implemented as a light-emitting device having a light-emitting structure 300 in which an N-semiconductor layer 310, an active layer 320 and a P-semiconductor layer 330 are sequentially stacked one above another, as shown in FIG. 5.

Finally, second electrodes are formed on the bottoms of the respective nitride semiconductor unit devices (step S170).

Figure 4:
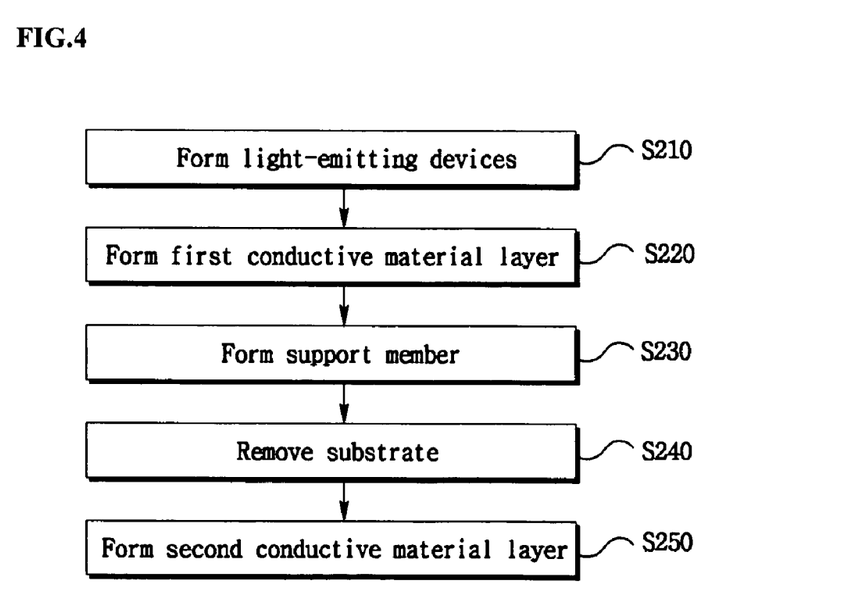
FIG. 4 is a flowchart illustrating a method for fabricating a nitride semiconductor device according to a further embodiment of the present invention.

FIG. 4 is a flowchart illustrating a method for fabricating a nitride semiconductor device according to a further embodiment of the present invention. First, a plurality of light-emitting devices each of which includes a nitride semiconductor layer and between which insulation layers are interposed are formed on a substrate (step S210).

Thereafter, a first conductive material layer is formed on the light-emitting devices and the insulation layers (step S220).

Subsequently, a support member is formed to be fixed to an upper surface of the first conductive material layer (step S230), and the substrate is removed from the bottoms of the plurality of light-emitting devices (step S240).

Finally, a second conductive layer is formed on the bottoms of the respective light-emitting devices (step S250).

As described above, with the method for fabricating a nitride semiconductor device according to the present invention, there is an advantage in that trenches isolating respective nitride semiconductor unit devices from one another are filled with crack-inhibiting walls to remove voids, thereby minimizing cracks or damage that may occur in the nitride semiconductor unit devices during a laser lift-off process.

Further, there is an advantage in that the crack-inhibiting walls are made of a dielectric material to lessen reactions with the unit devices, which are caused by heat applied during the bonding process, thereby preventing deterioration of the electrical and optical properties of the devices and providing electrical insulation between the nitride semiconductor unit devices by means of its inherent insulation property.

In addition, there is an advantage in that the dielectric material can be used as a protective layer, and the devices are bonded through a bonding-reinforcing plate or the crack-inhibiting walls to a carrier substrate with a bonding member coated thereon, thereby maintaining a strong bonding force to the carrier substrate.

Although the present invention has been illustrated and described in connection with the preferred embodiments, it will be readily understood by those skilled in the art that various modifications and changes can be made thereto within the scope of the present invention. It will be apparent that such modifications and changes fall within the scope of the present invention defined by the appended claims.

What is claimed is:

1. A method for fabricating a nitride semiconductor device, comprising the steps of:
   (a) forming repeatedly nitride semiconductor unit devices on a substrate, the nitride semiconductor unit devices being isolated from one another by trenches formed between the respective unit devices, the trenches being empty spaces;
   (b) forming electrodes on the respective nitride semiconductor unit device;
   (c) forming crack-inhibiting walls within the respective trenches;
   (d) forming a bonding-reinforcing plate on the electrodes and the crack-inhibiting walls, the bonding-reinforcing plate being made of a conductive material;
   (e) bonding a carrier substrate to the bonding-reinforcing plate through a bonding member; and
   (f) removing the substrate from the nitride semiconductor unit devices and the crack-inhibiting walls through a laser lift-off process.

2. The method as claimed in claim 1, after step (f), further comprising the steps of:
   (g) forming electrodes on the bottoms of the isolated nitride semiconductor unit devices; and
   (h) removing the crack-inhibiting walls, and portions of the bonding-reinforcing plate and the bonding member above the crack-inhibiting walls.

3. The method as claimed in claim 1, wherein the crack-inhibiting walls are formed to protrude beyond upper surfaces of the electrodes.

4. The method as claimed in claim 1, wherein the crack-inhibiting walls are made of a dielectric material.

5. The method as claimed in claim 1, wherein the conductive material is any of Al, Cu and Cr.

6. The method as claimed in claim 1, wherein each of the nitride semiconductor unit devices is a light-emitting device.

7. A method for fabricating a nitride semiconductor device, comprising the steps of:
   (a) forming repeatedly nitride semiconductor unit devices on a substrate, the nitride semiconductor unit devices being isolated from one another by trenches formed between the respective unit devices, the trenches being empty spaces;
   (b) forming electrodes on the respective nitride semiconductor unit device;
   (c) forming crack-inhibiting walls within the respective trenches;
   (d) forming a bonding-reinforcing plate by depositing a conductive material on the electrodes to be flush with upper surfaces of the crack-inhibiting walls;
   (e) bonding a carrier substrate to the bonding-reinforcing plate through a bonding member; and
   (f) removing the substrate from the nitride semiconductor unit devices and the crack-inhibiting walls through a laser lift-off process.

8. The method as claimed in claim 7, after step (f), further comprising the steps of:
   (g) forming electrodes on the bottoms of the isolated nitride semiconductor unit devices; and
   (h) removing the crack-inhibiting walls, and portions of the bonding-reinforcing plate and the bonding member above the crack-inhibiting walls.

9. The method as claimed in claim 7, wherein the crack-inhibiting walls are made of a dielectric material.

10. The method as claimed in claim 7, wherein the conductive material is any of Al, Cu and Cr.

11. The method as claimed in claim 7, wherein each of the nitride semiconductor unit devices is a light-emitting device.

12. A method for fabricating a nitride semiconductor device, comprising the steps of:
   (a) forming a plurality of nitride semiconductor unit devices on a substrate, the nitride semiconductor unit devices being isolated from one another by empty spaces with predetermined volume;
   (b) forming first electrodes on the respective nitride semiconductor unit devices;
   (c) forming insulation layers by filling the empty spaces with an insulation material;
   (d) forming a conductive material layer on the first electrodes and the insulation layers;
   (e) forming a support member to be fixed on the conductive material layer;
   (f) removing the substrate from the bottoms of the plurality of nitride semiconductor unit devices; and
   (g) forming second electrodes on the bottoms of the respective nitride semiconductor unit devices.

13. The method as claimed in claim 12, wherein the substrate is a non conductive substrate.

14. The method as claimed in claim 12, wherein the support member is an already-prepared carrier substrate.

15. The method as claimed in claim 14, wherein the carrier substrate is made of metal, and the carrier substrate is fixedly bonded to an upper surface of the conductive material layer through a bonding member.

16. The method as claimed in claim 15, wherein the bonding member is a solder.

17. The method as claimed in claim 12, wherein the support member is a metallic film deposited on the conductive material layer.

18. The method as claimed in claim 12, wherein the insulation material is polyimide or benzocyclobutene (BCB).

19. The method as claimed in claim 12, wherein each of the nitride semiconductor unit devices is a light-emitting device.

20. A method for fabricating a nitride semiconductor device, comprising the steps of:
   (a) forming a plurality of light-emitting devices with insulation layers interposed therebetween on a substrate, each of the light-emitting devices including a nitride semiconductor layer;
   (b) forming a first conductive material layer on the light-emitting devices and the insulation layers;
   (c) fixing and bonding a metal-formed substrate on the first conductive material layer using a bonding member, forming a support member to be fixed on the first conductive material layer;
   (d) removing the substrate from the bottoms of the plurality of light-emitting devices; and
   (e) forming a second conductive material layer on the bottoms of the light-emitting devices.

21. The method as claimed in claim 20, wherein the substrate is a non conductive substrate.

22. The method as claimed in claim 20, wherein the substrate is a sapphire substrate, and the sapphire substrate is separated from the light-emitting devices by radiating a laser beam on the bottom of the sapphire substrate.

23. A method for fabricating a nitride semiconductor device, comprising the steps of:
   (a) forming a plurality of light-emitting devices with insulation layers interposed therebetween on a substrate, each of the light-emitting devices including a nitride semiconductor layer;
(b) forming a first conductive material layer on the light-emitting devices and the insulation layers;
(c) forming a support member by depositing a metal film on the first conductive material layer;
(d) removing the substrate from the bottoms of the plurality of light-emitting devices; and
(e) forming a second conductive material layer on the bottoms of the light-emitting devices.

* * * * *